(12) United States Patent
Xiao et al.

(10) Patent No.: US 10,746,825 B2
(45) Date of Patent: Aug. 18, 2020

(54) ARRAY ANTENNA DRIVING METHOD AND DEVICE FOR THREE-DIMENSIONAL SCANNING NUCLEAR MAGNETIC RESONANCE IMAGER

(71) Applicant: CHINA UNIVERSITY OF PETROLEUM—BEIJING, Beijing (CN)

(72) Inventors: Lizhi Xiao, Beijing (CN); Guangzhi Liao, Beijing (CN); Wei Liu, Beijing (CN); Yao Wei, Beijing (CN); Yangyang Xu, Beijing (CN)

(73) Assignee: CHINA UNIVERSITY OF PETROLEUM-BEIJING, Beijing (CN)

( * ) Notice: Subject to any disclaimer, the term of this patent is extended or adjusted under 35 U.S.C. 154(b) by 1 day.

(21) Appl. No.: 16/238,369

(22) Filed: Jan. 2, 2019

(65) Prior Publication Data

US 2019/0219649 A1 Jul. 18, 2019

(30) Foreign Application Priority Data

Jan. 17, 2018 (CN) .......................... 2018 1 0043305

(51) Int. Cl.
*G01R 33/36* (2006.01)
*G01R 33/34* (2006.01)
(Continued)

(52) U.S. Cl.
CPC ....... *G01R 33/3664* (2013.01); *G01N 24/081* (2013.01); *G01R 33/3415* (2013.01);
(Continued)

(58) Field of Classification Search
CPC ............ G01R 33/3664; G01R 33/3415; G01R 33/34092; G01R 33/3621; G01R 33/3628;
(Continued)

(56) References Cited

U.S. PATENT DOCUMENTS 6,133,788 A * 10/2000 Dent ..................... H03F 1/0294
330/124 R
2005/0062472 A1 3/2005 Bottomley
(Continued)

FOREIGN PATENT DOCUMENTS

CN 1260497 A 7/2000
CN 103529442 A 1/2014
(Continued)

OTHER PUBLICATIONS

The Chinese First Examination Report of corresponding Chines application No. 201810043305.9, dated Apr. 12, 2019.

*Primary Examiner* — Daniel R Miller
(74) *Attorney, Agent, or Firm* — J.C. Patents

(57) ABSTRACT

Provided is an array antenna driving method and device for a three-dimensional scanning nuclear magnetic resonance imager, wherein each antenna to be operated is driven to transmit a nuclear magnetic pulse signal by receiving a control command sent by a control system; parsing the control command to generate a pulse transmission timing signal and an antenna switching control signal; processing an externally inputted high voltage signal according to the pulse transmission timing signal to output high voltage radio frequency pulses of a plurality of channels; and selecting a high voltage radio frequency pulse of at least one channel and the antenna to be operated in the nuclear magnetic resonance pulse array antenna according to the antenna switching control signal, and superposing the selected high voltage radio frequency pulse. The device of the present invention can improve multi-layer slice information detection of signals in circumferentially different azimuth zones.

8 Claims, 3 Drawing Sheets

(51) Int. Cl.
  *G01R 33/3415*    (2006.01)
  *G01N 24/08*      (2006.01)
  *G01V 3/32*       (2006.01)

(52) U.S. Cl.
  CPC ... *G01R 33/34092* (2013.01); *G01R 33/3607* (2013.01); *G01R 33/3621* (2013.01); *G01R 33/3628* (2013.01); *G01V 3/32* (2013.01)

(58) Field of Classification Search
  CPC .... G01R 33/3607; G01N 24/081; G01V 3/32; E21B 47/00; E21B 49/00
  See application file for complete search history.

(56) References Cited

U.S. PATENT DOCUMENTS

| | | | |
|---|---|---|---|
| 2013/0093422 A1* | 4/2013 | Morys | G01V 3/32 324/303 |
| 2013/0176140 A1* | 7/2013 | Tyshko | G01V 3/32 340/854.6 |
| 2016/0274204 A1* | 9/2016 | Song | G01N 24/081 |
| 2017/0082771 A1* | 3/2017 | Xiao | G01V 3/32 |

FOREIGN PATENT DOCUMENTS

| | | |
|---|---|---|
| CN | 105240002 | 1/2016 |
| WO | 2008/070430 A1 | 6/2008 |

* cited by examiner

ARRAY ANTENNA DRIVING METHOD AND DEVICE FOR THREE-DIMENSIONAL SCANNING NUCLEAR MAGNETIC RESONANCE IMAGER

CROSS-REFERENCE TO RELATED APPLICATIONS

This application claims priority to Chinese Patent Application No. 201810043305.9, filed on Jan. 17, 2018, which is incorporated herein by reference in its entirety.

TECHNICAL FIELD

The present invention relates to the field of nuclear magnetic resonance logging technology, and in particular, to an array antenna driving method and device for a three-dimensional scanning nuclear magnetic resonance imager.

BACKGROUND

The Nuclear Magnetic Resonance (NMR) phenomenon was discovered in 1946 and soon afterwards applied in the fields of physics, chemistry, materials science, life sciences, and medicine. In the 1950s, nuclear magnetic resonance began to be used in the oil and gas industry, initially in the field of reservoir rock physics. The NMR logging tool can use the principle of nuclear magnetic resonance to detect the stratum information around the wellbore, and has unique qualitative identification and quantitative evaluation capabilities on a reservoir fluid.

A probe is one of the important components of the nuclear magnetic resonance logging tool. The structure of the probe determines the key performance such as measurement method of the tool, nuclear magnetic resonance region and nuclear magnetic resonance signal strength. The probe for the nuclear magnetic resonance logging tool mainly includes a magnet and an antenna. The magnet can form a static magnetic field for polarizing a spin hydrogen proton, and the antenna can transmit an radio frequency field for turning the spin hydrogen proton, and after removing the radio frequency field, the spin hydrogen proton begin to process along the static magnetic field, which produces a nuclear magnetic resonance inductive signal, the stratum conditions can be analyzed by detecting the nuclear magnetic resonance inductive signal.

The probe in existing nuclear magnetic resonance logging tool mostly uses a columnar magnet. The two ends of the magnet are N pole and S pole respectively. The magnetic field distribution is formed by closed magnetic lines from the N pole pointing to the S pole. The antenna surrounds the magnet and can excite the polarized stratum region at 360° around the wellbore so that there is no detection blind region around the wellbore and it is possible to perform multi-frequency and multi-slice measurement, but the measured signal can only be an average signal of signals in the stratum at 360°. Therefore, the nuclear magnetic resonance logging tool in the prior art can only perform signal detections of radial depth dimension and axial depth dimension, and does not have signal detection capability of circumferential multi-directional sensitive region, and further, there is no driving device that can drive the nuclear magnetic resonance logging tool to perform three-dimensional scanning.

SUMMARY

The present invention provides an array antenna driving method and device for a three-dimensional scanning nuclear magnetic resonance imager, so as to realize driving of an array antenna for a three-dimensional scanning nuclear magnetic resonance imager, and realize stratum detection in radial, axial and circumferential three-dimensions.

One aspect of the present invention provides an array antenna driving device for a three-dimensional scanning nuclear magnetic resonance imager, including:

a bus interface module connected to a control system and configured to receive a control command sent by the control system;

a pulse timing processing module connected to the bus interface module and configured to parse the control command to generate a pulse transmission timing signal and an antenna switching control signal;

a multi-channel high-power pulse transmitting module including a plurality of pulse transmitting channels respectively connected to the pulse timing processing module, each of the pulse transmitting channels being configured to process an externally inputted high voltage signal according to the pulse transmission timing signal and outputs a high voltage radio frequency pulse; and a antenna switching interface module connected to the multi-channel high-power pulse transmitting module, the pulse timing processing module, and a nuclear magnetic resonance pulse array antenna, and configured to select a pulse transmitting channel and an antenna to be operated in the nuclear magnetic resonance pulse array antenna according to the antenna switching control signal, and superpose the high voltage radio frequency pulse outputted by each of the selected pulse transmitting channels to drive the antenna to be operated to transmit a nuclear magnetic pulse signal.

Further, the pulse transmitting channel includes:

a pulse generating sub-module connected to the pulse timing processing module and configured to convert the pulse transmission timing signal to a radio frequency signal;

a power tube driving sub-module connected to the pulse generating sub-module and configured to perform power amplification on the radio frequency signal to generate a chopping driving signal; and a high voltage chopping sub-module connected to the power tube driving sub-module and the externally inputted high voltage signal and configured to chop the externally inputted high voltage signal according to the chopping driving signal to generate the high voltage radio frequency pulse.

Further, the antenna switching interface module includes a plurality of first switches and a plurality of second switches connected to the pulse timing processing module;

each of the first switches is connected to one of the pulse transmitting channels, for connecting the selected pulse transmitting channel according to the antenna switching control signal; and at least one of the second switches is connected to an antenna of the nuclear magnetic resonance pulse array antenna, for connecting the antenna to be operated according to the antenna switching control signal.

Further, the antenna switching interface module further includes a coupling transformer;

The coupling transformer is configured to connect the multi-channel high power pulse transmitting module and the nuclear magnetic resonance pulse array antenna.

An output end of each of the plurality of pulse transmitting channels serves as a primary winding, and an input end of each antenna of the nuclear magnetic resonance pulse array antennas serves as a secondary winding, and the primary winding and the secondary winding are both wound around a magnetic core of the coupling transformer.

Further, at least one of phase, amplitude and frequency parameters of the high voltage radio frequency pulse outputted by each of the pulse transmitting channels is different.

Another aspect of the present invention provides an array antenna driving method for a three-dimensional scanning nuclear magnetic resonance imager, including:

receiving a control command sent by a control system;

parsing the control command to generate a pulse transmission timing signal and an antenna switching control signal;

processing an externally inputted high voltage signal according to the pulse transmission timing signal to output high voltage radio frequency pulses of a plurality of channels; and selecting a high voltage radio frequency pulse of at least one channel and an antenna to be operated in the nuclear magnetic resonance pulse array antenna according to the antenna switching control signal, and superposing the selected high voltage radio frequency pulse to drive the antenna to be operated to transmit a nuclear magnetic pulse signal.

Further, the processing an externally inputted high voltage signal according to the pulse transmission timing signal to output high voltage radio frequency pulses of a plurality of channels specifically includes:

converting the pulse transmission timing signal into a radio frequency signal;

performing power amplification on the radio frequency signal to generate a chopping driving signal; and chopping the externally inputted high voltage signal according to the chopping driving signal to generate the high voltage radio frequency pulses.

Further, the superposing the selected high voltage radio frequency pulse to drive the antenna to be operated to transmit a nuclear magnetic pulse signal specifically includes:

inputting by a primary winding the selected high voltage radio frequency pulse to a coupling transformer for superposing; and outputting by a secondary winding to the antenna to be operated to drive the antenna to be operated to transmit a nuclear magnetic pulse signal.

Further, at least one of phase, amplitude and frequency parameters of the high voltage radio frequency pulses of the plurality of channels is different.

In the array antenna driving method and device for a three-dimensional scanning nuclear magnetic resonance imager provided by the present invention, each antenna to be operated is driven to transmit a nuclear magnetic pulse signal, which is achieved by receiving a control command sent by a control system; parsing the control command to generate a pulse transmission timing signal and an antenna switching control signal; processing an externally inputted high voltage signal according to the pulse transmission timing signal to output high voltage radio frequency pulses of a plurality of channels; and selecting a high voltage radio frequency pulse of at least one channel and the antenna to be operated in the nuclear magnetic resonance pulse array antenna according to the antenna switching control signal, and superposing the selected high voltage radio frequency pulse. The array antenna driving device for the three-dimensional scanning nuclear magnetic resonance imager of the present invention can output different high voltage radio frequency pulses to the nuclear magnetic resonance pulse array antenna, can realize convenient and quick feed to an antenna or antennas, and can detect single azimuth stratum information by exciting a single antenna, and detect multi-azimuth stratum information by exciting a plurality of antennas, thereby multi-layer slice information detection of signals in circumferentially different azimuth zones is realized, improving the circumferential resolution of the probe of the nuclear magnetic resonance tool, and realizing stratum detection in radial, axial and circumferential three-dimensions.

BRIEF DESCRIPTION OF THE DRAWINGS

In order to more clearly illustrate embodiments of the present invention or technical solutions in the prior art, the drawings used in the embodiments or in the prior art will be briefly described below. Obviously, the drawings in the following descriptions are only some embodiments of the present invention, and based on these drawings other drawings can be obtained by those skilled in the art without any creative labor.

REFERENCE SIGNS

100: array antenna driving device for a three-dimensional scanning nuclear magnetic resonance imager; 110: bus interface module; 120: pulse timing processing module; 130: multi-channel high-power pulse transmitting module; 131: pulse generating sub-module; 132: power tube driving sub-module; 133: high voltage chopping sub-module; 140: antenna switching interface module; 141: first switch; 142: coupling transformer; 143: second switch; 200: control system; 300: nuclear magnetic resonance pulse array antenna; 310: antenna.

DETAILED DESCRIPTION OF THE EMBODIMENTS

The technical solutions in the embodiments of the present invention are clearly and completely described in the following with reference to the accompanying drawings in the embodiments of the present invention. It is obvious that the described embodiments are only some of the embodiments of the present invention, but not all embodiments. All other embodiments obtained by those skilled in the art based on the embodiments of the present invention without creative efforts are within the scope of the present invention.

Figure 1:
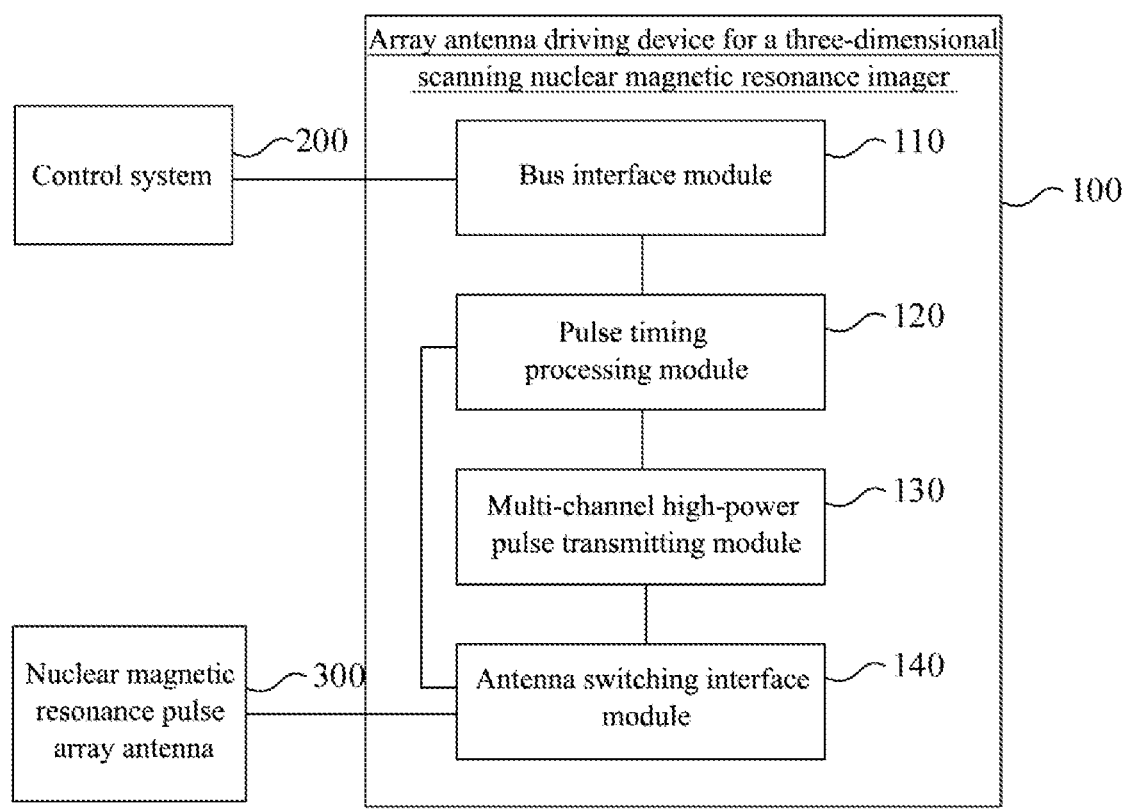
FIG. 1 is a structural diagram of an array antenna driving device for a three-dimensional scanning nuclear magnetic resonance imager according to an embodiment of the present invention.

FIG. 1 is a structural diagram of an array antenna driving device for a three-dimensional scanning nuclear magnetic resonance imager according to an embodiment of the present invention. One aspect of the present invention provides an array antenna driving device for a three-dimensional scanning nuclear magnetic resonance imager 100, including: a bus interface module 110, a pulse timing processing module 120, a multi-channel high power pulse transmitting module 130, and an antenna switching interface module 140.

Wherein, the bus interface module 110 is connected to the control system 200, to receive a control command sent by the control system 200;

the pulse timing processing module 120 is connected to the bus interface module 110, to parse the control command and generate a pulse transmission timing signal and an antenna switching control signal;

the multi-channel high-power pulse transmitting module 130 includes a plurality of pulse transmitting channels, which are connected to the pulse timing processing module 120, and each of the pulse transmitting channels is configured to process an externally inputted high voltage signal according to the pulse transmission timing signal and output a high voltage radio frequency pulse;

the antenna switching interface module 140 is connected to the multi-channel high-power pulse transmitting module 130, the pulse timing processing module 120, and a nuclear magnetic resonance pulse array antenna 300, and is configured to select a pulse transmitting channel and an antenna 310 to be operated in the nuclear magnetic resonance pulse array antenna 300 according to the antenna switching control signal, and superpose the high voltage radio frequency pulse outputted by the selected pulse transmitting channel to drive the antenna 310 to be operated to transmit a nuclear magnetic pulse signal.

In this embodiment, the nuclear magnetic resonance pulse array antenna 300 includes a plurality of antennas, and the antennas may be a strip antenna or a saddle antenna. The plurality of antennas may be disposed according to a predetermined azimuth, for example, the plurality of antennas are disposed outside a magnet and distributed along the circumferential direction of the magnet, or the plurality of antennas are respectively disposed on outside of at least two layers of magnets, upper layer and lower layer, and distributed along the circumferential direction of the magnets, etc. An antenna or antennas 310 are fed by the array antenna driving device for a three-dimensional scanning nuclear magnetic resonance imager 100 of the embodiment, a single azimuth stratum information can be detected by exciting a single antenna, and multi-azimuth stratum information can be detected by exciting a plurality of antennas, and thereby multi-layer slice information detection of signals in circumferentially different azimuth zones is realized, improving the circumferential resolution of the probe of the nuclear magnetic resonance tool, and realizing stratum detection in radial, axial and circumferential three-dimensions.

The array antenna driving device for a three-dimensional scanning nuclear magnetic resonance imager 100 of the present embodiment is connected to the control system 200 (host computer) on the ground through the bus interface module 110, receives a control command sent by the control system 200, decodes the control command through the pulse timing processing module 120 to generate a pulse transmission timing signal and an antenna switching control signal, wherein the pulse transmission timing signal is used by a plurality of pulse transmitting channels in the multi-channel high-power pulse transmitting module 130 to process externally inputted high voltage signal according to the pulse transmission timing signal, and output high voltage radio frequency pulses of a plurality of channels, wherein the high voltage radio frequency pulses of a plurality of channels may be the same or different, and the antenna switching control signal is used by the antenna switching interface module 140 to select a pulse transmitting channel to be accessed and an antenna to be operated in the nuclear magnetic resonance pulse array antenna 300, the high voltage radio frequency pulse outputted by the selected pulse transmitting channel being superposed to drive the antenna to be operated to transmit a nuclear magnetic pulse signal. By superposition of the high voltage radio frequency pulses of a plurality of channels, it is possible to output different types of high voltage radio frequency pulses, such as soft pulses, higher peak pulses, to drive the antenna 310 to transmit a nuclear magnetic pulse signal.

Figure 2:
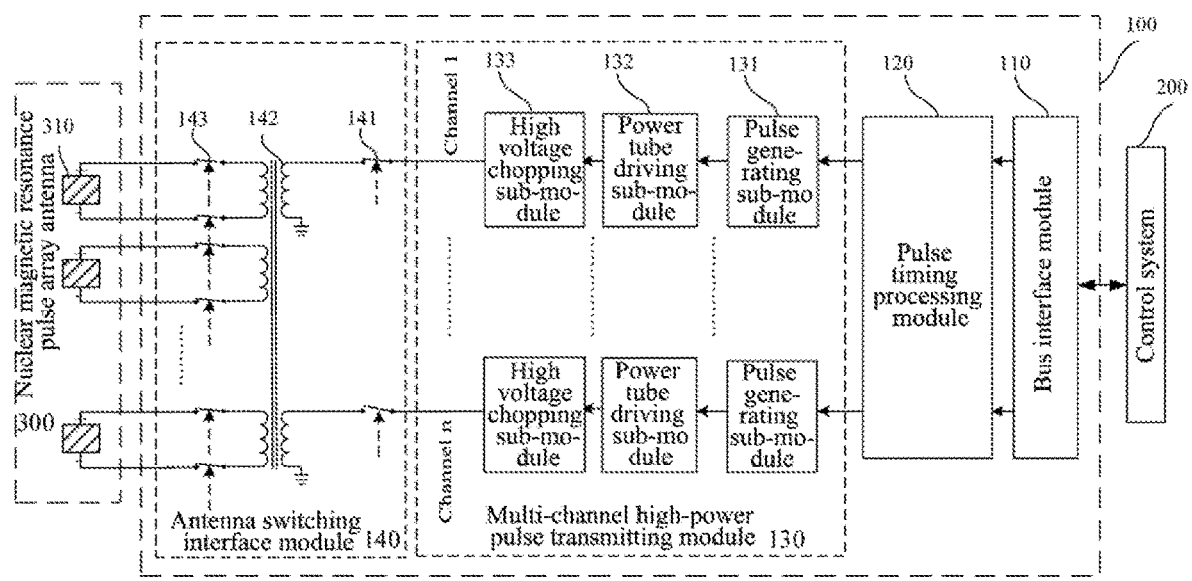
FIG. 2 is a structural diagram of an array antenna driving device for a three-dimensional scanning nuclear magnetic resonance imager according to another embodiment of the present invention.

In this embodiment, each of the pulse transmitting channels of the multi-channel high-power pulse transmitting module 130 is specifically shown in FIG. 2, and includes a pulse generating sub-module 131, a power tube driving sub-module 132, and a high voltage chopping sub-module 133, which can convert the pulse transmission timing signal into a radio frequency signal, perform power amplification on the radio frequency signal to generate a chopping driving signal, and chop the externally inputted high voltage signal according to the chopping driving signal to generate the high voltage radio frequency pulse, in sequence. In the embodiment, the multi-channel high-power pulse transmitting module 130 is preferably four pulse transmitting channels, and can realize output of soft pulses by superposition of high voltage radio frequency pulses.

The antenna switching interface module 140 is connected to the multi-channel high-power pulse transmitting module 130, the pulse timing processing module 120 and the nuclear magnetic resonance pulse array antenna 300, and may include a plurality of control switches connected to the pulse timing processing module 120 to control switch of the selected pulse transmitting channels and the antennas 310 to be operated according to the antenna switching control signal.

Of course, the multi-channel high-power pulse transmitting module 130 and the antenna switching interface module 140 are not limited to the above structures, and other multi-channel high-power pulse transmitting module 130 and antenna switching interface module 140 that can achieve the object of the present invention also can be used and will not be repeatedly described here.

In the array antenna driving device for a three-dimensional scanning nuclear magnetic resonance imager provided by the invention, each antenna to be operated is driven to transmit a nuclear magnetic pulse signal by receiving the control command sent by the control system; parsing the control command to generate a pulse transmission timing signal and an antenna switching control signal; processing an externally inputted high voltage signal according to the pulse transmission timing signal to output high voltage radio frequency pulses of a plurality of channels; and selecting a high voltage radio frequency pulse of at least one channel and the antenna to be operated in the nuclear magnetic resonance pulse array antenna according to the antenna switching control signal, and superposing the selected high voltage radio frequency pulse. The array antenna driving device for a three-dimensional scanning nuclear magnetic resonance imager of the present embodiment can output different high voltage radio frequency pulses to the nuclear magnetic resonance pulse array antenna, realize convenient and quick feed to an antenna or antennas, and can detect single azimuth stratum information by exciting a single antenna, and detect multi-azimuth stratum information by exciting a plurality of antennas, thereby multi-layer slice information detection of signals in circumferentially different azimuth zones can be realized, improving the circumferential resolution of the probe of the nuclear magnetic resonance tool, and realizing stratum detection in radial, axial and circumferential three-dimensions.

FIG. 2 is a structural diagram of an array antenna driving device for a three-dimensional scanning nuclear magnetic resonance imager according to another embodiment of the present invention. As a further improvement of the above embodiment, the pulse transmitting channel may specifically include: a pulse generating sub-module 131, a power tube driving sub-module 132, and a high voltage chopping sub-module 133.

Wherein the pulse generating sub-module 131 is connected to the pulse timing processing module 120 and is used to convert a pulse transmission timing signal into a radio frequency signal;

the power tube driving sub-module 132 is connected to the pulse generating sub-module 131 and is used to perform power amplification on the radio frequency signal to generate a chopping driving signal; and the high voltage chopping sub-module 133 is connected to the power tube driving sub-module 132 and an externally inputted high voltage signal and is used to chop the externally inputted high voltage signal according to the chopping driving signal to generate the high voltage radio frequency pulse.

In this embodiment, the pulse generating sub-module 131 receives the pulse transmission timing signal sent by the pulse timing processing module 120, and converts the pulse transmission timing signal into a radio frequency signal satisfying nuclear magnetic resonance pulse timing, and the frequency of the radio frequency signal determines the frequency of the high voltage radio frequency pulse outputted by corresponding pulse transmitting channel, and the number of cycles of the radio frequency signal determine the bandwidth of the high voltage radio frequency pulse outputted by the corresponding pulse transmitting channel. It should be noted that parameters, such as frequencies, the number of cycles, and phases, of radio frequency signals in different pulse transmitting channels may be the same or different. The power tube driving sub-module 132 receives the radio frequency signal sent by the pulse generating sub-module 131, performs power amplification on the radio frequency signal to generate a chopping driving signal, and sends the chopping driving signal to the high voltage chopping sub-module 133 to make the high voltage chopping sub-module 133 drive an element such as high-power field effect transistor inside the high voltage chopping sub-module 133 to quickly switch according to the chopping driving signal, thereby controlling the high-power field effect transistor to perform chopping on the externally inputted high voltage signal to generate a high voltage radio frequency pulse. The high voltage signal in this embodiment is outputted by the high voltage chopping sub-module 133, and is usually a DC high voltage signal. For the pulse generating sub-module 131, the power tube driving sub-module 132, and the high voltage chopping sub-module 133 in the pulse transmitting channel, specific implementation manner of each of these modules can be determined by those skilled in the art according to actual needs, and will not described in detail in this embodiment.

Further, the antenna switching interface module 140 includes a plurality of first switches 141 and a plurality of second switches 143, which are connected to the pulse timing processing module 120.

Each of the first switches 141 is coupled to one pulse transmitting channel, for connecting the selected pulse transmitting channel according to the antenna switching control signal;

At least one of the second switches 143 is connected to one antenna 310 of the nuclear magnetic resonance pulse array antenna 300, for connecting the antenna 310 to be operated according to the antenna switching control signal.

In this embodiment, the antenna switching interface module 140 controls the first switches 141 according to the antenna switching control signal so as to control which pulse transmitting channel is to be connected, and controls the second switch 143 so as to control which antenna 310 is to be connected, thereby causing the high voltage radio frequency pulses outputted by the selected pulse transmitting channel to be superposed and then outputted to the antenna 310 to be operated. For a pulse transmitting channel and an antenna 310, which are not to be operated, corresponding first switch 141 and corresponding second switch 143 are disconnected to prevent interference of signal coupling or the like or damage to other component.

Further, the antenna switching interface module 140 further includes a coupling transformer 142;

The coupling transformer 142 is configured to connect the multi-channel high-power pulse transmitting module 130 and the nuclear magnetic resonance pulse array antenna 300.

An output end of each of the plurality of pulse transmitting channels serves as a primary winding, and an input end of each antenna of the nuclear magnetic resonance pulse array antennas 300 serves as a secondary winding, and the primary winding and the secondary winding are both wound around a magnetic core of the coupling transformer 142.

In this embodiment, the superposition of the high voltage radio frequency pulses from different pulse transmitting channels is realized by the coupling transformer 142, where the high voltage radio frequency pulses are inputted into the same coupling transformer 142 through corresponding primary windings, and due to electromagnetic mutual inductance effect of the coupling transformer, the superposed high voltage radio frequency pulses are outputted to the antenna(s) 310 to be operated by corresponding secondary winding(s). Preferably, in the embodiment, the high voltage radio frequency pulses can be amplified by the coupling transformer 142, and the amplification factor can be 1.2, thereby realizing a high-power driving of the antenna 310. Of course, it is possible other amplification factor. In addition, the coupling transformer 142 can provide isolation so that there is no DC loop between a front stage and a rear stage, and a channel for an AC signal is provided, and furthermore, the coupling transformer 142 can achieve impedance matching to achieve better energy transfer between the front stage and the rear stage.

Further, at least one of phase, amplitude and frequency parameters of the high voltage radio frequency pulse outputted by each of the pulse transmitting channels in the above embodiment is different, so that different high-frequency radio frequency pulse signals can be finally superposed to meet the driving of the nuclear magnetic resonance pulse array antenna 300 under different operating conditions.

Figure 3:
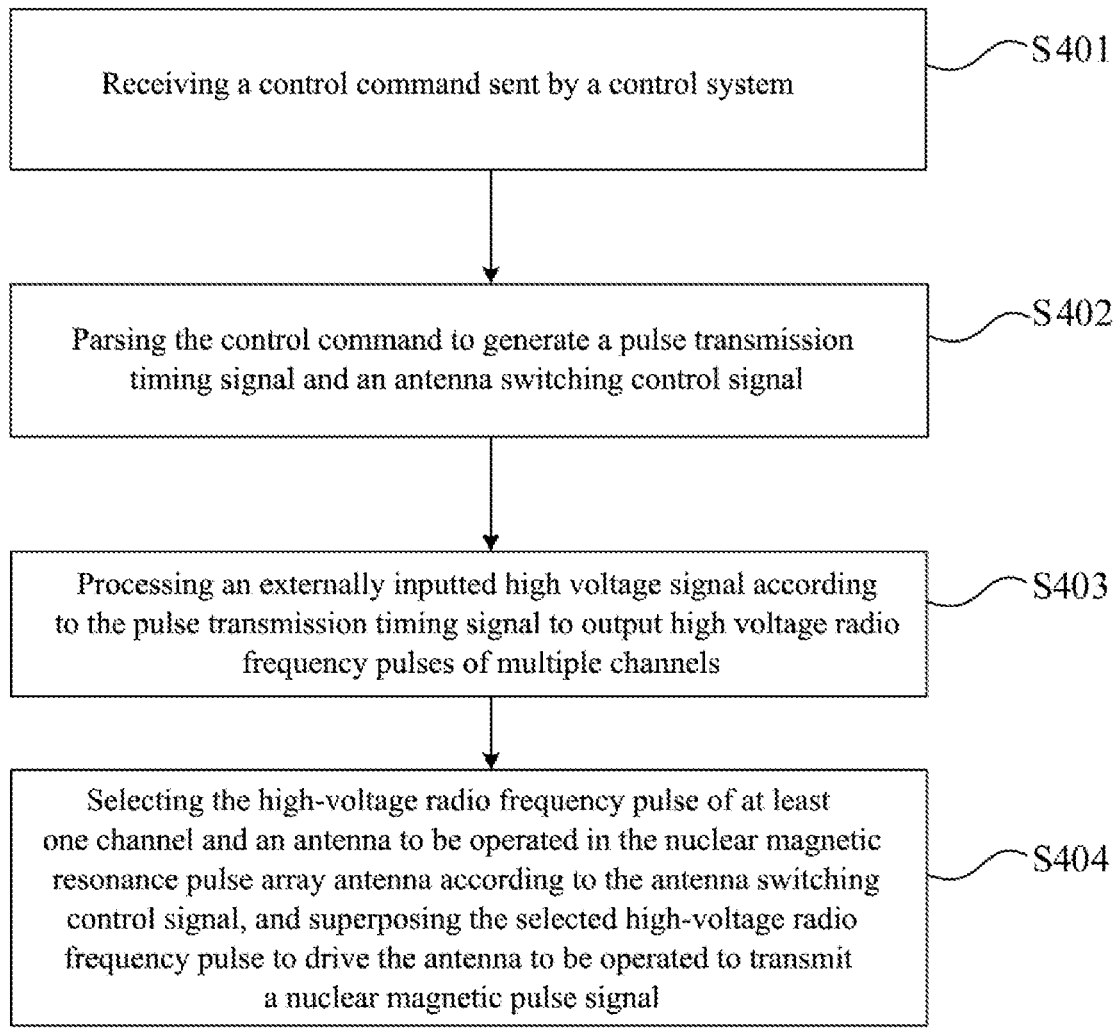
FIG. 3 is a flowchart of an array antenna driving method for a three-dimensional scanning nuclear magnetic resonance imager according to an embodiment of the present invention.

FIG. 3 is a flowchart of an array antenna driving method for a three-dimensional scanning nuclear magnetic resonance imager according to an embodiment of the present invention. As shown in FIG. 3, this embodiment provides an array antenna driving method for a three-dimensional scanning nuclear magnetic resonance imager, including specific steps as follows:

S401: receiving a control command sent by a control system.

S402: parsing the control command to generate a pulse transmission timing signal and an antenna switching control signal.

S403: processing an externally inputted high voltage signal according to the pulse transmission timing signal to output high voltage radio frequency pulses of a plurality of channels.

S404: selecting the high voltage radio frequency pulse of at least one channel and an antenna to be operated in the nuclear magnetic resonance pulse array antenna according to the antenna switching control signal, and superposing the selected high voltage radio frequency pulse to drive the antenna to be operated to transmit a nuclear magnetic pulse signal.

Further, the processing an externally inputted high voltage signal according to the pulse transmission timing signal to output high voltage radio frequency pulses of a plurality of channels specifically includes:

converting the pulse transmission timing signal into a radio frequency signal;

performing power amplification on the radio frequency signal to generate a chopping driving signal; and chopping the externally inputted high voltage signal according to the chopping driving signal to generate the high voltage radio frequency pulse.

Further, the superposing the selected high voltage radio frequency pulse to drive the antenna to be operated to transmit a nuclear magnetic pulse signal specifically includes:

inputting by a primary winding the selected high voltage radio frequency pulse into a coupling transformer to perform superposition and outputting by a secondary winding to the antenna to be operated to drive the antenna to be operated to transmit a nuclear magnetic pulse signal.

Further, at least one of phase, amplitude and frequency parameters of high voltage radio frequency pulses of the plurality of channels is different.

The array antenna driving method for a three-dimensional scanning nuclear magnetic resonance imager provided by embodiments of the present invention can be implemented by device embodiments provided above in FIG. 1 and FIG. 2, and specific functions are not described here again.

In the array antenna driving method for a three-dimensional scanning nuclear magnetic resonance imager provided by the present embodiment, each antenna to be operated is driven to transmit a nuclear magnetic pulse signal by receiving a control command sent by a control system; parsing the control command to generate a pulse transmission timing signal and an antenna switching control signal; processing an externally inputted high voltage signal according to the pulse transmission timing signal to output high voltage radio frequency pulses of a plurality of channels; and selecting the high voltage radio frequency pulse of at least one channel and the antenna to be operated in the nuclear magnetic resonance pulse array antenna according to the antenna switching control signal, and superposing the selected high voltage radio frequency pulse. The array antenna driving method for a three-dimensional scanning nuclear magnetic resonance imager of the present embodiment can output different high voltage radio frequency pulses to the nuclear magnetic resonance pulse array antenna, and can realize convenient and quick feed to an antenna or antennas, and can detect single azimuth stratum information by exciting a single antenna, and detect multi-azimuth stratum information by exciting a plurality of antennas, thereby multi-layer slice information detection of signals in circumferentially different azimuth zones is realized, improving circumferential resolution of the probe of the nuclear magnetic resonance tool, and realizing stratum detection in radial, axial and circumferential three-dimensions.

It should be understood that the device and method disclosed in several embodiments provided by the present invention can be implemented in other manners. For example, the device embodiments described above are merely illustrative. For example, the division of units is only a logical function division, there may be other division manner in actual implementation, for example, a plurality of units or components may be combined or integrated into another system, or some features can be ignored or not executed. In addition, coupling or direct coupling or communication connection shown or discussed may be an indirect coupling or communication connection through an interface, device or unit, and may be electrical, mechanical or other forms of coupling or communication connection.

The units described as separate components may or may not be physically separated, and the components displayed as units may or may not be physical units, that is, they may be located in one place, or may be distributed to a plurality of network units. Some or all of the units may be selected according to actual needs to achieve the purpose of the solution of the embodiment.

In addition, each functional unit in each embodiment of the present invention may be integrated into one processing unit, or each unit may exist physically separately, or two or more units may be integrated into one unit. The above integrated unit can be implemented in the form of hardware or in the form of hardware plus software functional unit.

The above integrated unit implemented in the form of the software functional unit can be stored in a computer readable storage medium. The software functional unit described above is stored in one storage medium and includes multiple instructions and thus one computer device (which may be a personal computer, a server, or a network device, etc.) or processor is used to perform some of the steps of the methods of the various embodiments of the present invention. The foregoing storage medium includes various media that can store program codes, such as a U disk, a mobile hard disk, a read-only memory (ROM), a random access memory (RAM), a magnetic disk, or an optical disk.

Those skilled in the art can clearly understand that for convenience and brevity of description, the division of functional modules described above is only taken as an example for illustration. In practical applications, the above function assignment can be completed by different functional modules as needed, that is, the internal structure of the device is divided into different functional modules to perform all or part of the functions described above. For the specific working process of the device described above, reference may be made to the corresponding process of the foregoing method embodiments, and the details are not described here again.

Finally, it should be noted that the above embodiments are merely illustrative of the technical solutions of the present invention, and are not intended to be limiting; although the present invention has been described in detail with reference to the foregoing embodiments, those skilled in the art will understand that the technical solutions described in the foregoing embodiments may be modified, or some or all of the technical features described therein may be equivalently replaced; and the modifications or replacements do not deviate from the range of the technical solutions of the embodiments of the present invention.

What is claimed is:

1. An array antenna driving device for a three-dimensional scanning nuclear magnetic resonance imager, comprising:

a bus interface module connected to a control system and configured to receive a control command sent by the control system;

a pulse timing processing module connected to the bus interface module and configured to parse the control command to generate a pulse transmission timing signal and an antenna switching control signal;

a multi-channel high-power pulse transmitting module including a plurality of pulse transmitting channels respectively connected to the pulse timing processing module, each of the pulse transmitting channels being configured to process an externally inputted high voltage signal according to the pulse transmission timing signal and output a high voltage radio frequency pulse; and an antenna switching interface module connected to the multi-channel high-power pulse transmitting module, the pulse timing processing module, and a nuclear magnetic resonance pulse array antenna, and configured to select more than one pulse transmitting channel and an antenna to be operated in the nuclear magnetic resonance pulse array antenna according to the antenna switching control signal, and superpose, by a same coupling transformer, the high voltage radio frequency pulse outputted by each of the selected pulse transmitting channel to drive the antenna to be operated to transmit a nuclear magnetic pulse signal, wherein at least one of phase, amplitude, and frequency parameters of the high voltage radio frequency pulse outputted by each of the plurality of pulse transmitting channels is different.

2. The device according to claim 1 wherein each of the pulse transmitting channels comprises:

a pulse generating sub-module connected to the pulse timing processing module and configured to convert the pulse transmission timing signal to a radio frequency signal;

a power tube driving sub-module connected to the pulse generating sub-module, and configured to perform power amplification on the radio frequency signal to generate a chopping driving signal; and a high voltage chopping sub-module connected to the power tube driving sub-module and the externally inputted high voltage signal and configured to chop the externally inputted high voltage signal according to the chopping driving signal to generate the high voltage radio frequency pulse.

3. The device according to claim 1, wherein the antenna switching interface module comprises a plurality of first switches and a plurality of second switches connected to the pulse timing processing module;

each of the first switches is connected to one of the pulse transmitting channels, for connecting the selected pulse transmitting channel according to the antenna switching control signal; and at least one of the second switches is connected to one antenna of the nuclear magnetic resonance pulse array antenna, for connecting the antenna to be operated according to the antenna switching control signal.

4. The device according to claim 3, wherein
the coupling transformer is configured to connect the multi-channel high power pulse transmitting module and the nuclear magnetic resonance pulse array antenna.

5. The device according to claim 4, wherein:
an output end of each of the plurality of pulse transmitting channels serves as a primary winding, and an input end of each antenna of the nuclear magnetic resonance pulse array antenna serves as a secondary winding, and the primary winding and the secondary winding are both wound around a magnetic core of the coupling transformer.

6. An array antenna driving method for a three-dimensional scanning nuclear magnetic resonance imager, comprising:

receiving a control command sent by a control system;

parsing the control command to generate a pulse transmission timing signal and an antenna switching control signal;

processing an externally inputted high voltage signal according to the pulse transmission timing signal to output high voltage radio frequency pulses of a plurality of channels; and selecting a high voltage radio frequency pulse of more than one channel and an antenna to be operated in nuclear magnetic resonance pulse array antenna according to the antenna switching control signal, and superposing, by a same coupling transformer the selected high voltage radio frequency pulse to drive the antenna to be operated to transmit a nuclear magnetic pulse signal, at least one of phase, amplitude and frequency parameters of the high voltage radio frequency pulses of the plurality of channels is different.

7. The method according to claim 6, wherein the processing an externally inputted high voltage signal according to the pulse transmission timing signal to output high voltage radio frequency pulses of a plurality of channels specifically comprises:

converting the pulse transmission timing signal into a radio frequency signal;

performing power amplification on the radio frequency signal to generate a chopping driving signal; and chopping the externally inputted high voltage signal according to the chopping driving signal to generate the high voltage radio frequency pulses.

8. The method according to claim 6, wherein the superposing the selected high voltage radio frequency pulse to drive the antenna to be operated to transmit a nuclear magnetic pulse signal specifically comprises:

inputting by a primary winding the selected high voltage radio frequency pulse to the same coupling transformer for superposing; and outputting by a secondary winding to the antenna to be operated to drive the antenna to be operated to transmit a nuclear magnetic pulse signal.

* * * * *